(12) United States Patent
Goldsmith et al.

(10) Patent No.: US 6,356,166 B1
(45) Date of Patent: Mar. 12, 2002

(54) MULTI-LAYER SWITCHED LINE PHASE SHIFTER

(75) Inventors: Gary S. Goldsmith, Kirkland; Donn Harvey, Issaquah; Sheldon K. Meredith, Duvall; Thomas Shafer, Seattle, all of WA (US)

(73) Assignee: Metawave Communications Corporation, Redmond, WA (US)

( * ) Notice: Subject to any disclaimer, the term of this patent is extended or adjusted under 35 U.S.C. 154(b) by 0 days.

(21) Appl. No.: 09/384,114

(22) Filed: Aug. 26, 1999

(51) Int. Cl.[7] .................................................. H01P 1/18
(52) U.S. Cl. ..................... 333/161; 333/164; 342/368
(58) Field of Search ................................ 333/161, 164, 333/156

(56) References Cited

U.S. PATENT DOCUMENTS 5,424,696 A * 6/1995 Nakahara et al. ....... 333/161 X

FOREIGN PATENT DOCUMENTS

| JP | 172401 | * | 8/1986 | ................. 333/164 |
| JP | 143403 | * | 6/1989 | ................. 333/156 |

* cited by examiner

Primary Examiner—Benny Lee
(74) Attorney, Agent, or Firm—Fulbright & Jaworski, L.L.P.

(57) ABSTRACT

The present invention provides systems and methods for phase shifting signals wherein the phase shifting circuitry may be disposed in a relatively small footprint. The preferred embodiment utilizes PIN diodes to provide switched line phase shifting, wherein the switched lines are microstrip and/or stripline transmission lines of predetermined lengths. To minimize the space required, the switched lines of the preferred embodiment are disposed on different layers of a multi-layered support structure, such as a multi-layer circuit board. Layer changing vias are preferably adapted to provide a constant impedance to thereby make changes in layers in the transmission path electrically transparent to a transmitted signal.

57 Claims, 3 Drawing Sheets

MULTI-LAYER SWITCHED LINE PHASE SHIFTER

BACKGROUND

It is often desirable to provide a means to phase shift a signal, such as a radio frequency (RF) carrier signal. For example, relative phase shifts between simulcast signals may be used to provide radiation pattern shaping and beam forming from an antenna. Moreover, it may be desirable to provide for adjusting or selecting such relative phase shifts in order to provide steerable antenna beams.

In a beam-forming architecture where the antenna is mechanically fixed, phase shift control allows radiation patterns to be created which can handle multiple simultaneous cellular phone calls, or improvements to radar systems which require spatially agile antennas. In order to make an antenna pattern electronically changeable, a phase shifter is, for example, often used. Such phase shifters are used to change the relative phase between the individual radiating elements of an antenna, while keeping frequency and amplitude fixed. The electronics that are suitable for phase shift control can fall into many different categories, depending on design parameters, signal requirements, and the like. Accordingly, adjustable phase shifter designs are realized through various technologies, each with its own performance advantages and disadvantages. For example, a ferrite core phase shifter requires a lot of space, is very heavy, and experiences hysteresis (a previous command must be erased before another command is written to the device). They also consume large amounts of DC power, but can handle high signal power.

A quadrature modulator is another effective way to change the phase of a signal, but such devices are very limited in terms of their input power-handling capability. Therefore, it exacerbates the design of the network around it, in order to control the input signal level, while accommodating a large variation after the modulator. Using a quadrature modulator to phase shift a signal requires applying DC voltages to its intermediate frequency (IF) inputs, but to do so requires learning this behavior, and then providing a lookup table of phase versus IF voltage in order to use the device. However, quadrature modulators are typically compact (often realized as integrated chip sets) and provide substantially unlimited phase resolution.

Another type of phase shifter, "loaded line," uses selectable transmission lines to reactively load, i.e., with capacitance or inductance, to change the insertion phase of the device. These loaded line phase shifters can have high insertion loss—a significant portion of the input signal power is lost. They can also have low linearity, measured as a figure of merit called intercept performance, and therefore distort a signal even at low power levels. Accordingly, although loaded line phase shifters are generally compact, they are lossy, have poor dynamic range, are typically expensive, and employ high-risk designs.

Finally, there are switched-line phase shifters, which allow selection of one signal path or another, made of various lengths of transmission lines, which effectively changes the electrical length, and therefore the phase, of the composite path. Switched line phase shifters are generally limited to relatively narrow bandwidths because they utilize transmission line lengths designed for one particular frequency. As other frequencies are utilized therewith, the phase shifter will appear electrically longer or shorter. Dynamic range is limited by the linearity of the switching devices, and only quantized states are available. Also, they typically occupy large areas, and can have poor isolation. However, switched line phase shifters employ low risk designs that are inexpensive, have low loss, and provide adequate RF power handling.

From the above, it can be seen that there is a trade off between several designs, and operational factors, such as insertion loss, intercept performance (which controls linearity of the signal), bandwidth, and the like. Cost is also a factor, as is the number of separate phase shifters required and available space. For example, in a system which provides multiple narrow antenna beams in order to provide complete 360° coverage about a cellular base transceiver station, not only are multiple phase shifters required to form a single beam, but multiple sets are required to form multiple beams. Thus, factors such as cost and size can become critical, Accordingly, there is a need in the art for providing phase shifters which provide a desired degree of phase resolution, with low insertion loss, high linearity, good dynamic range, low power consumption, small size, low risk, and low cost.

SUMMARY OF THE INVENTION

These and other objects, features and technical advantages are achieved by a system and method employing a phase shifter design which uses a switched line structure on a printed circuit board, or other support structure. Systems operating over a relatively narrow bandwidth, such as 869 to 894 MHz associated with the cellular transmit band for example, are very acceptable for the application of this form of phase shifter.

In order to provide fine resolution, i.e., an ability to provide for relatively small incremental changes in phase shift, over a broad range, a preferred embodiment of the present invention defines multiple switched line sections with increasingly smaller lengths. Preferably, the lengths are designed to be cardinal states of a digital control word. Accordingly the line lengths are successively divided in half, i.e., if the greatest line length in the switched line phase shifter is 180° ($\lambda/2$, where $\lambda$ is the wavelength in the dielectric media of the design frequency), the next is 90° ($\lambda/4$), the next is 45° ($\lambda/8$), and the next is 22.5° ($\lambda/16$), until the finest resolution desired is reached. Accordingly, if a specific phase shift is desired, a control system may be operated to activate, or command, certain sections of the phase shifter, corresponding to a specific digital control word, in order to achieve a net phase shift.

It should be appreciated that the above described phase shifter could require a substantial amount of space, such as a large surface area on a circuit board, in order to provide the line lengths necessary to achieve both the desired range of phase shift and a desired resolution. Moreover, there is the likelihood that placing a number of such switched lines, either from a single phase shifter of multiple segments or multiple such phase shifters, in near proximity, such as on a circuit board, may result in adjacent sections being electrically coupled to each other. In other words, poor signal isolation can be a result if steps are not taken to control this phenomenon.

The preferred embodiment phase shifter is small in order to take up less space on a circuit board, or other supporting structure, contrary to generally accepted practice. Additionally, the preferred embodiment phase shifter provides high linearity in order for it to handle higher power signals. Likewise, the phase shifter of the present invention preferably exhibits relatively low loss. Preferably, the phase shifter of the present invention provides phase shifting with low DC power consumption, which becomes very important in circumstances where a relatively large number of phase shifters are utilized, such as when many simultaneous antenna beams are generated.

In achieving the above described attributes, the phase shifter of a preferred embodiment of the present invention utilizes microstrip and/or stripline transmission lines of selected lengths to provide switched line lengths which are small in size, low loss, inexpensive, and provide good isolation of signals. A stripline is an RF transmission line disposed, or "sandwiched," between two ground planes, most often within a dielectric media. Accordingly, striplines may be buried within the strata of a circuit board and, thus, can utilize the same area in one dimension (e.g., the x-y plane), while being separated in another dimension (e.g. the z-axis), to occupy a small amount of space per phase shifter. Of course, other structure for providing phase shifts, such as surface acoustic wave (SAW) devices, different forms of transmission media providing different rates of propagation, and the like, may be utilized, i.e., switchably selected, according to the present invention. Moreover, these various structures may be separated in various planes as described above.

Utilizing multiple different layers to minimize the space occupied by a phase shifter suggests the use of layer changing transitions, such as layer changing vias in a printed circuit board. However, it should be appreciated that in any high-frequency transmission path, it is desirable to maintain constant impedance to avoid such undesirable results as signal reflection, higher insertion loss, and the like. Accordingly, stratum or layer changing vias adapted to maintain constant impedance are preferably utilized in providing transmission paths of the present invention. Primarily, a layer changing via as used in a circuit board is a hole drilled in the dielectric substrate, and plated to connect transmission lines disposed on various layers of the substrate. Preferably, the constant impedance layer changing vias of the present invention are as described above, and adhere to a specific design geometry to maintain constant impedance. Of course, layer-changing vias of the present invention may be widely used in structures other than the circuit board of the preferred embodiment. For example, vias adapted according to the present invention may be utilized in stratified structures such as monolithic integrated circuits, such as may be provided by properly doping areas of the monolithic structure to define stratum-changing vias.

Using the preferred embodiment vias adapted to provide consistent impedance, the preferred embodiment striplines may be disposed on multiple layers of a multi-layer printed circuit board and provide electrically transparent transitions from one layer to another. For example, utilizing the vias of the preferred embodiment, changing a transmission line from the surface of the circuit board, such as a microstrip transmission line, to a buried line, such as a stripline transmission line, the layer changing via is adapted to appear electrically transparent as possible to the transmitted signal. Accordingly, a transmission line, although changing layers in a circuit board and/or changing between forms of transmission line, continues to behave like one of constant impedance, such as 50 Ohms.

Often the substrate, in addition to having transmission lines disposed thereon, also includes grounding layers, such as ground plane layers disposed on the surfaces and intervening layers or strata, of the substrate. Often these grounding layers are utilized in providing isolation between signals and a DC-reference for applied voltages. They are also commonly used as a ground reference for RF signals, to define the impedance of the transmission lines. Accordingly, there is a clearance between the conductor associated with the transmission of RF signals, and the metalized ground plane, such as the above mentioned stripline and microstrip structures, and the layer changing vias.

The dimension of the clearance between the conductor of a via and the ground plane will define the capacitance and inductance, or reactance, of the layer changing via. For example, if the ground clearance is too small, the via will appear capacitive. Contrariwise, if the ground clearance is too large, the via will be inductive. Accordingly, if the ground clearance of a layer changing via is not properly selected, the via will appear to the signal as an instantaneous change in system impedance, which looks reflective to an incoming RF wave that is propagating through the transmission line. Accordingly, a preferred embodiment of the present invention utilizes circuit boards having layer changing vias employing predetermined ground plane clearances, such as between the plated pads where the stripline and/or microstrip connects to the vias, and the surrounding ground plane, in order to provide consistent impedance in the signal path. Additionally, the size, or diameter, of the vias of the preferred embodiment are selected so as to provide consistent impedance in the signal path.

Utilizing design rules, empirically developed in attaining the present invention, it is possible to provide a change in a transmission line between layers without upsetting the system impedance, Such as with the above mentioned preferred embodiment vias. Therefore, the preferred embodiment of the present invention, utilizing such design rules to provide vias to move transmission lines between various layers of dielectric such as in a printed circuit board, can compact the size of the phase shifter. Moreover, the layer changing vias, designed empirically to maintain system impedance, improve the return loss associated with the vias. Experimentation has revealed the worst case for the preferred embodiment device described herein, tested over the entire phase constellation, is approximately −14 dB, with a large percentage of the states being anywhere from −25 dB to −30 dB. Accordingly, the preferred embodiment phase shifter may be integrated into an RF cascade configuration without upsetting the system impedance, loss, and passband ripple of the composite circuit.

A preferred embodiment of the present invention utilizes PIN diodes, such as surface mount PIN diodes, in providing switching of the various transmission lines of the phase shifter. These diodes operate in the on-biased region, with very little DC bias current. Preferably two such diodes are used per switchable transmission line section to allow selection of a phase shift associated with the transmission line, by properly biasing the diodes.

For example, where the eight different sections, and therefore different phase shift, switched lines of a preferred embodiment phase shifter are utilized, each having a zero phase shift reference line associated therewith for selection when the phase shift of a particular section is not desired, 32 such diodes would be provided. However, only 16 of these 32 diodes would be ON at any one time. A preferred embodiment PIN diode commercially available requires only 3.5 milliamperes (mA) of bias current. Accordingly, the above example biasing of 16 diodes per phase shifter would utilize approximately 56 mA to operate one phase shifter. With a 5-volt power supply, this would require approximately 17.5 milliwatts per section, or 0.28 Watts total consumption for the preferred embodiment, which is very low for a commercial design. Moreover, the PIN diodes of the preferred embodiment have very low insertion loss with just a diminutive amount of bias current. Therefore, total loss through the above described eight sections of a preferred embodiment phase shifter results in four to five decibels (dB) of loss.

A preferred embodiment of the phase shifter exhibits high linearity, measured as Third-Order Intercept (IP3), using the aforementioned PIN diodes. A preferred embodiment PIN diode operates with an output IP3 of +40 dB above a milliwatt (+40 dBm). Cascading eight sections of the above described phase shifter with the low insertion loss, results in a total output IP3 of +25 dBm.

A preferred embodiment of the phase shifter uses eight of the above mentioned switched line sections, the smallest resolution of which is 2.8° for RF frequencies of approximately 894 MHZ. Utilizing the above described transmission lines disposed on different layers, these switched lines may be deployed in a small area, such as approximately four square inches (in.$^2$) of circuit board. Accordingly, this preferred embodiment phase shifter can provide 256 states with a resolution of slightly less than three degrees, occupying a surface area of about four in.$^2$.

It should be appreciated that the parts of the preferred embodiment, utilizing PIN diodes, stripline and/or microstrip transmission lines, biasing resistors, and tuning inductors and capacitors, are negligible in cost. For example, at today's prices it is estimated that the cost of an entire phase shifter is well under $10 and most likely in the $6 range.

Accordingly, it is a technical advantage of the present invention that phase shifting is provided with a desired degree of resolution, with low insertion loss, and/or with a high degree of RF linearity. Moreover, a further technical advantage is realized by the present invention providing any or all of the above features in the art for phase shifters in a relatively small package. A still further technical advantage of the present invention is that a phase shifter having the above features may be provided inexpensively.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention disadvantages thereof, reference is now made to the following descriptions taken in conjunction with the accompanying drawing, in which.

DETAILED DESCRIPTION

Figure 1:
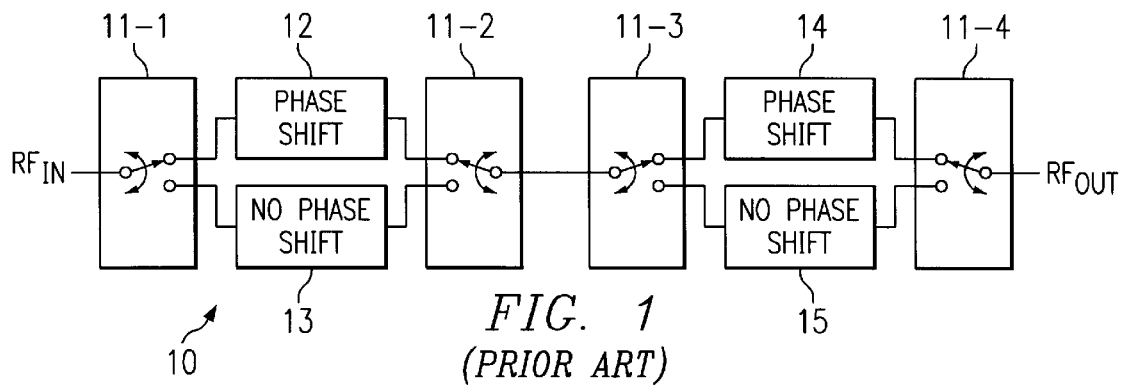
FIG. 1 shows a prior art switched line phase shifter circuit.

In understanding the present invention it is helpful to understand the operation of a typical switched line phase shifter. Directing attention to FIG. 1, a prior art switched line phase shifter is shown generally as phase shifter circuit 10.

Following the path through circuit 10, an RF signal is introduced at $RF_{IN}$ and propagates through circuit 10 to $RF_{OUT}$ with no relative phase shift if switches 11-1, 11-2, 11-3, and 11-4 select the no-phase shift state of switched lines 13 and 15, i.e., the phase shifter of circuit 10 appears to the signal propagating through as a straight transmission line having no relative phase shift associated therewith (relative to the other switch selections). The non-shifted phase associated with transmission through the "no-phase-shift" state is illustrated as wave 20 (ASIN ($\omega t$)) in FIG. 2.

Phase shifted signals are represented by waves 21 (ASIN ($\omega t+\Phi_1$)) and 22 (ASIN ($\omega t+\Phi_1+\Phi_2$)), where $\Phi_1$ and $\Phi_1+\Phi_2$ represent the amount of relative phase shift over that of wave 20 associated with the "no-phase-shift" state. It should be appreciated that each of waves 20, 21, and 22 represent the same signal with identical amplitude, A, and frequency, $\omega$, but has been shifted in time to the right.

Figure 2:
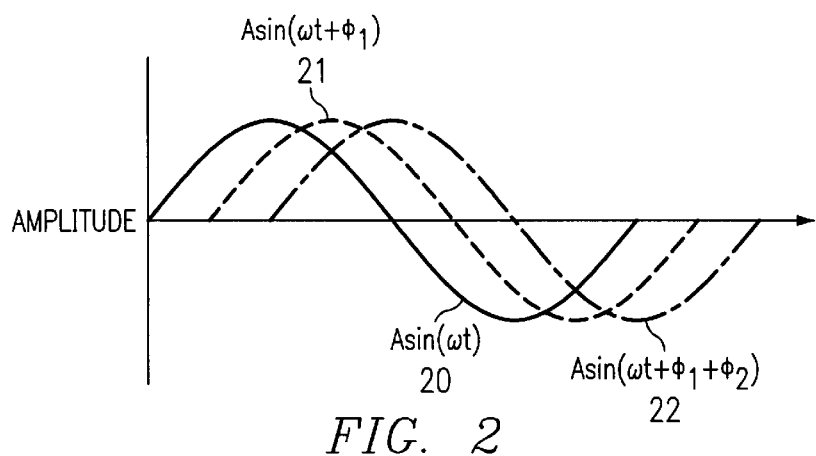
FIG. 2 shows the relative phase shift of signals provided by a phase shifter.

Referring again to FIG. 1, the phase shifts illustrated in FIG. 2 can be accomplished in circuit 10 by controlling switches 11-1, 11-2, 11-3, and 11-4 to select the transmission lines 12 and 14. For example, changing switches 11-1 and 11-2 to connect to transmission line 12 while leaving switches 11-3 and 11-4 connected to transmission line 15, provides the phase shift represented by wave 21 (ASIN ($\omega t+\Phi_1$)). However, if a greater phase shift was desired, circuit 10 may be operated to select the other phase shift state in addition to, or in the alternative to the one described above. For example switches 11-1 and 11-2 may remain connected to transmission line 12, while switches 11-3 and 11-4 are changed to select transmission line 14, selecting phase shift ($\Phi_2$, to provide the phase shift of wave 22 (ASIN ($\omega t+\Phi_1+\Phi_2$)).

Figure 3:
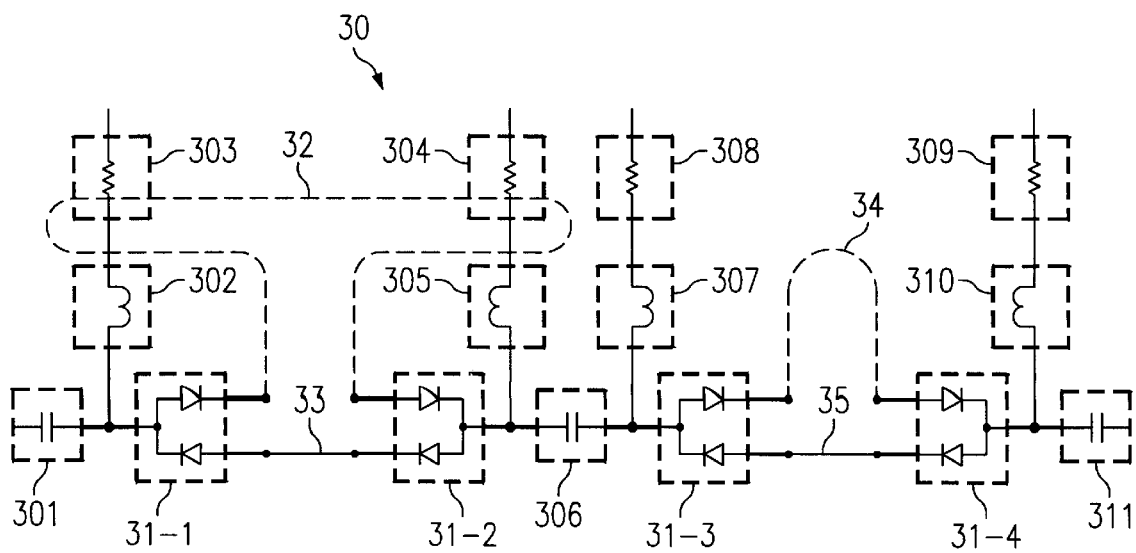
FIG. 3 shows a preferred embodiment of a phase shifter of the present invention.

Directing attention to FIG. 3, a preferred embodiment of a phase shifter circuit of the present invention is illustrated as phase shifter circuit 30. It should be appreciated that the transmission lines 33 and 35 of FIG. 3 correspond to the no-phase shift functions illustrated in FIG. 1, and the transmission lines 32 and 34 of FIG. 3 correspond to the phase shift functions 12 and 14 in FIG. 1, respectively. Likewise, the diode pairs 31-1, 31-2, 31-3, and 31-4 of FIG. 3 correspond to switches 11-1, 11-2, 11-3, and 11-4 of FIG. 1. In the preferred embodiment of the present invention, the diode pairs 31-1, 31-2, 31-3, and 31-4 are PIN diodes, such as may be provided utilizing surface mount PIN diode technology, biased to behave like Single-Pole-Double-Throw (SPDT) switches. Of course, other switching technology may be employed according to the present invention, such as Field-Effect-Transistor (FET) switches, if desired.

It should be appreciated that the phase shift provided by lines 32 and 34 do not have to be equal. In fact, it is preferable that these two phases be different as that allows more resolution around the entire phase constellation, giving greater control, for example, of an antenna pattern that is formed using the relative phase shift between its radiating elements. Switches 31-1, 31-2 and the alternate transmission lines between them represent one phase shift section of phase shifter 30. Specifically, switched line 33 is associated with no phase shift, and may be selected by proper operation of switches 31-1 and 31-2 when no phase shift is desired for this particular section. Switched line 32 is a relatively longer transmission line that provides a predetermined amount of propagation delay and thus an associated amount of phase shift. The exact amount of phase shift is expressed as $\Phi=l/\lambda$, where l is the differential length between the lines 32 and 33, and $\lambda$ is the wavelength of the signal propagating through the phase shifter. Accordingly, by operation of switches 31-1 and 31-2, switched line 32 may be selected in order to introduce a preselected amount of phase shift to a signal propagating there through.

In order to provide fine resolution, i.e., an ability to provide for relatively small incremental changes in phase shift, over a broad range, a preferred embodiment of the present invention defines multiple switched line sections with increasingly smaller differential lengths.

Accordingly, although illustrated in FIG. 3 as including only two phase shift sections, a preferred embodiment phase shifter of the present invention provides 8 switches line sections, the smallest resolution of which is 2.8°. Preferably, the lengths are designed to be successively divided. Therefore, a preferred embodiment providing the above 2.8° smallest resolution, would also include phase states of 5.6°, 11.2°, 22.5°, 45°, 90°, and 180°. (The eighth "odd" state is an exception, described in subsequent paragraphs.) This arrangement makes the entire phase shifter appropriate for digital control. Accordingly, if a specific phase shift is desired, a digital control word may be used to switch in certain differential lengths to achieve the desired phase shift. For example (ignoring the odd state for now), the binary control word, 0110110, could be used to result in the following phase shift: (0×2.8°)+(1×5.6°)+(1×11.2°)+(0× 22.5°)+(1×45°)+(1×90°)+(0×180°)=151.8° total phase shift. This allows for selection of 128 equally spaced states at a resolution of 2.8° around the entire phase constellation.

Although the preferred embodiment is described herein with reference to switched line transmission paths, it should be appreciated that the present invention may employ any number of phase shifting structures. For example, the present invention may utilize propagation delays associated with transmission of a signal through a particular media, such as a SAW device, or may use reactively-loaded lines instead of differential line lengths, to provide similar results.

In a preferred embodiment of the present invention, transmission paths of the phase shifter are realized as microstrip and/or stripline. Microstrip is a transmission line made of a conductor suspended over a reference ground plane with a dielectric substrate in-between. Stripline is a transmission line structure made of usually a conductor "sandwiched" between, two reference ground planes usually by two dielectric substrates. Whereas with microstrip, where RF fields are loosely constrained, stripline is a preferred structure for tightly confining electromagnetic fields, making it more appropriate for improving isolation between adjacent transmission lines.

Figure 4A:
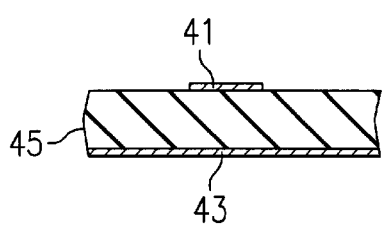
FIGS. 4A and 4B show microstrip and stripline transmission lines respectively.
Figure 4B:
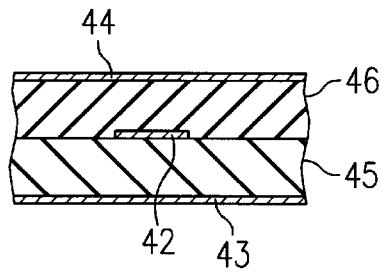

FIG. 4A illustrates the cross-section of conductor and ground plane 43 around dielectric substrate 45 to realize a microstrip transmission line. FIG. 4B illustrates a cross-section of conductor 42, ground planes 43 and 44 around dielectric substrates 45 and 46, respectively, to realize a stripline transmission line. In each structure, the ratio of the width of the conductor to the spacing between the conductor and ground plane(s), determines the impedance of the transmission line, as does the relative dielectric constant of the substrate. For example, where a transmission line having 50 Ohms impedance is desired, a preferred embodiment of stripline printed on FR4 dielectric, utilizes a conductor width of roughly 8 mils sandwiched between ground planes separated by 16 mils. It should be appreciated that such small line widths, as well as the tightly confined fields, allow the transmission lines to be tightly radiused and, therefore, any long differential lines to be folded over to fit within a compact surface area. Of course, other dimensions and dielectric constants of materials may be utilized to achieve similar results.

Also provided in the preferred embodiment illustrated in FIG. 3 are components 301 through 311. These components provide the DC biasing to the diodes of switches 31-1, 31-2, 31-3, and 31-4. As with the preferred embodiment PIN diodes, components 301 through 311 are preferably surface-mount components.

Capacitors 301, 306, and 311 are DC-blocking/RF-coupling devices. These components allow an RF signal to pass from one phase shifting section to the other, while preventing DC bias currents of one section from being passed to the other section. Accordingly, the preferred embodiment of FIG. 3 may be operated to uniquely bias each phase shifter section so as to provide individual control of each section.

Inductors 302, 305, 307, and 310 are DC-coupling/RF-blocking devices, commonly referred to as RF chokes. These components prevent the RF signal from leaking out onto the DC bias lines, or conversely, prevent the bias lines from upsetting the impedance of the transmission lines. Resistors 303, 304, 308, and 309 are preferably provided to control the magnitude of the bias current to the PIN diodes, given a fixed voltage.

In a preferred embodiment, switches 31-1, 31-2, 31-3, and 31-4, which in the preferred embodiment are realized as PIN diodes, as well as components 301 through 311, are located on the top external layer of the multi-layered circuit board. As it is almost exclusively possible to access only the exterior of such a circuit board, preferred embodiments of the present invention will use components mounted on the exterior surface(s) in order to ensure the phase shifter is inexpensive to manufacture and maintain. Of course, there are examples of realizing similar functions on internal layers (such as transistors, diodes, resistors, inductors, and capacitors within integrated circuits), but typically at a much higher price and performance penalty.

It may not be possible to put any or all of the selectable transmission lines of the present invention (such as the switched lines 32, 33, 34 and 35 of FIG. 3) on the same layer as the components (such as switches 31-1, 31-2, 31-3, and 31-4 and/or components 301 through 311 of FIG. 3) and achieve the desired size and performance aspects. Nor may it be possible to dispose multiple or all of the selectable transmission lines (switched lines 32, 33, 34 and 35) on one layer. For example, where switched line 32 is associated with a relatively long phase shift, this length of transmission line may be physically realized with a very long line, such as compared to switched line 34. Where a desired size of the phase shifter of the present invention is sufficient only to accommodate a portion of this phase shifting structure, multiple layers may be utilized to provide for the complete phase shifting structure. Likewise, a switched line of considerable length may itself require multiple layers in order to accommodate its length within a desired space.

Accordingly, in order to make the circuitry of the phase shifter of the present invention more compact, a preferred embodiment disposes various portions of the circuitry illustrated in FIG. 3 on different layers. For example, in a most preferred embodiment, where switches 31-1, 31-2, 31-3, and 31-4 and components 301 through 311 are disposed on atop surface of a circuit board, the selectable transmission lines in the preferred embodiment, or portions thereof, are disposed on other layers of the circuit board in order to allow their overlap in the plane of the circuit board.

Figure 5:
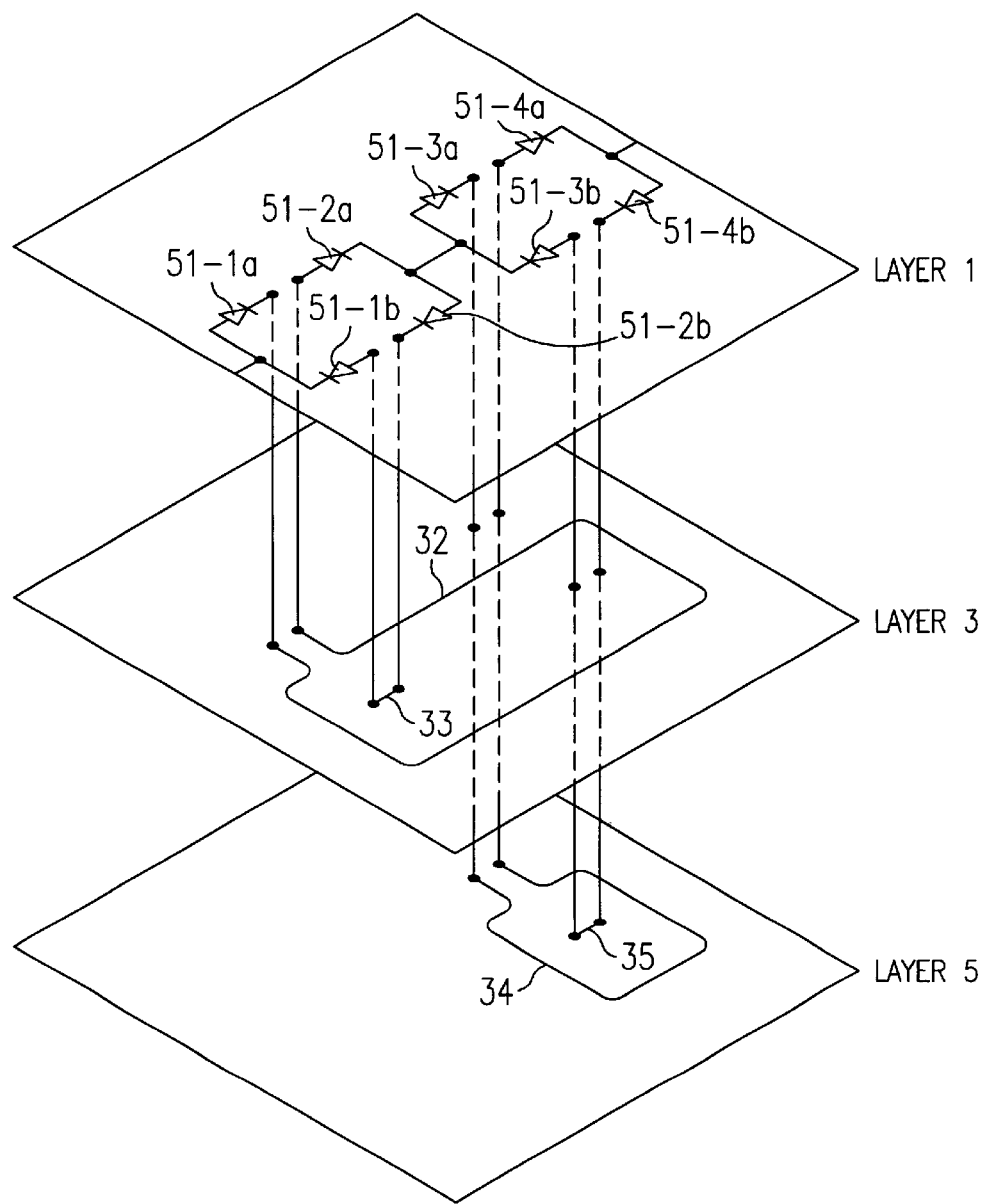
FIG. 5 shows an isometric view of a multi-layered phase shifter of the present invention.

Therefore, in a preferred embodiment of the phase shifter of FIG. 3, three layers might be utilized to provide transmission lines of sufficient length and sufficiently isolated to provide a phase shifter of the present invention having a desired small footprint. Directing attention to FIG. 5, an isometric view of a preferred embodiment multiple layer configuration of phase shifter 30 of FIG. 3 is shown. In the embodiment of FIG. 5, diodes 51-1a, 51-1b, 51-2a, 51-2b, 51-3a, 51-3b, 51-4a, and 51-4b of the preferred embodiment switches 31-1, 31-2, 31-3, and 31-4 of FIG. 3 respectively are disposed on layer 1 of the multiple layer structure. Switched lines 32 and 33, associated with the phase shift of the first phase shifting section of the phase shifter of FIG. 3, are disposed on layer 3 (there is preferably an intervening ground plane on layer 2 not shown). Switched lines 34 and 35, associated with the phase shift of the second phase shifting section of the phase shifter of FIG. 3, are disposed on layer 5 (there is preferably another intervening ground plane on layer 4, also not shown). It can be readily appreciated from the illustration of FIG. 5 that it is possible to provide a phase shifter of a particular desired foot print size which includes multiple sections that can occupy the same surface footprint, thus confining the total required circuit board area.

It should be appreciated that portions of phase shifter 30 may also be disposed on the same layer. Using the preferred embodiment stripline transmission lines, isolation between various transmission lines is great enough that they may be disposed in relatively near proximity to one another. Moreover, using the preferred embodiment narrow stripline transmission lines, relatively tight radiuses may be formed in bends that they may be folded back on themselves, such as in accordion fashion, to further reduce the required space.

In the preferred embodiment the switched lines associated with the "zero" phase shift (transmission lines 33 and 35 in FIG. 3) are disposed on the same layer as the corresponding phase shifting switched lines (transmission lines 32 and 34 in FIG. 3) because the layer changing vias constitute some finite electrical length which would add phase error to each section if not compensated for elsewhere. Thus, by including these vias for both the "zero" and finite phase shift lines of each section, and placing the "zero" and finite phase shift lines on the same layer, the effects of the layer changing vias can be designed out of the equation for calculating the required physical line length for each desired phase shift section. It should be appreciated that the preferred embodiment microstrip and stripline transmission lines facilitate the relatively close placement of the "zero" and finite phase transmission lines in each section. This permits the use of space-efficient components, such as commercially available SOT-23 series-tee PIN diode packages, available from Alpha Industries, Wobun, Mass., used in the preferred embodiment.

In alternative embodiments of the present invention, the transmission lines may be disposed on layers other than as illustrated in FIG. 5. However, in the preferred embodiment, where the footprint of the phase shifter is insufficient to allow physical separation of these two sections on a single layer and achieve required isolation between them, the switched lines are disposed on separate layers of the phase shifter stratum. Although not shown, it should be appreciated that portions of a single transmission line may be disposed on multiple layers of the phase shifter stratum. For example, switched line 32 may be partially disposed on layer 5 and partially disposed on layer 3, such as where the foot print of the phase shifter is insufficient to accommodate the full size of this transmission line on a single layer.

In a preferred embodiment, the transmission paths of phase shifter 30 utilize microstrip and/or stripline transmission lines. Accordingly, disposed between the layers of FIG. 5 are ground plane layers. By disposing a ground plane layers between layer 1 and layer 3, between layer 3 and layer 5, and beneath layer 5, the transmission lines on layer 1 become microstrip whereas the switched lines 32, 33, 34, and 35 are stripline. Accordingly, the above mentioned size constraints may be accommodated while providing physical and electrical separation.

It is desirable to maintain a constant impedance in the transmission paths of the phase shifter of the present invention to avoid undesired results such as reflections, mismatch loss, phase inaccuracies, and the like. Normally transitions such as that associated with layer changing vias, constitute abrupt changes in RF impedance and wreak havoc on the composite impedance match of the phase shifter. Accordingly, stratum or layer changing vias adapted to maintain the system impedance are preferably utilized in providing transmission paths of the present invention. A layer changing via as used in a circuit board is a hole drilled in a substrate, such as the dielectric material sandwiched between the layers, that is plated with conductive material to electrically connect transmission lines disposed on various layers. Of course, layer-changing vias of the present invention may be provided in structures other than the circuit board of the preferred embodiment. For example, vias adapted according to the present invention may be utilized in stratified structures such as monolithic integrated circuits, such as may be provided by properly doping areas of the monolithic structure to define stratum-changing vias.

It should be appreciated that the layer changing vias described above may be drilled through the entire thickness of the strata, or may be drilled through a portion, thus connecting the transmission line on one layer to a transmission line on another layer, without any excess. The first approach is far easier to manufacture but can result in performance problems. The latter is far less reliable to manufacture but may be preferable in high-frequency applications or wherein sufficient surface area is available for the via feed-through.

Figure 6:
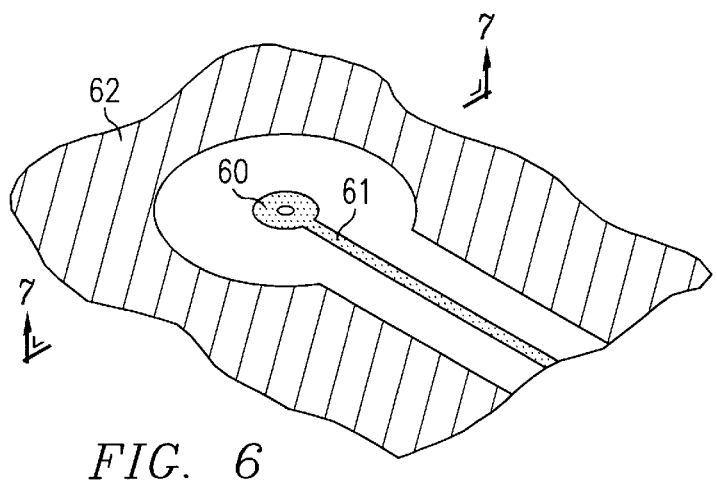
FIG. 6 shows an isometric view of a layer changing via of the present invention.

FIG. 6 illustrates an example of a preferred embodiment transmission line of layer 1 of a multi-layer structure, such as that of FIG. 5. Here transmission line 61, preferably a microstrip transmission line, ends in a layer changing via, 60. The microstrip and via are surrounded by a ground plane surface, 62, which may be provided in areas of layer 1 not occupied by transmission lines, or components, in order to provide isolation of signals, provide an easily accessible ground reference for shunt components such as tuning inductors and capacitors, and the like. It should be appreciated that the ground plane surface substantially encircles via 60, providing a desired clearance there between.

In the preferred embodiment, the layer changing via presents the same impedance as the transmission lines connected thereto, such as the 50 Ohms of the preferred embodiment described above. However, where the transmission line physically ends in a via and changes to a different layer, without proper adaptation of the via, there will be an impedance mismatch causing reflected signals and other undesired effects. Accordingly, the preferred embodiment of the present invention utilizes vias wherein the dimension of the separation between the via and the edge of the surrounding ground plane is designed to result in a desired impedance, preferably closely matching that of the transmission line itself. It should be appreciated that according to the preferred embodiment a proper clearance is maintained between the via and the edge of the ground plane layer on any intervening ground plane throughout the stratum. For example, in the preferred embodiment of the present invention as illustrated in FIG. 5, there are intervening ground planes disposed on layers between layers 1 and 3, layers 3 and 5, and beneath layer 5. Where a via passes through an intervening ground plane layer, there should be a hole, or void in the ground plane that adheres to the proper clearance described above.

It has been empirically determined that providing a separation between the ground plane and the widest dimension of a layer changing via, the dimension described above, of approximately three times the diameter of the widest dimension of the via itself, maintains a 50 ohm impedance. For the external layers i.e., layer 1, the widest dimension of the via itself includes the pad around the drilled hole. For internal layers, i.e., layers 3 and 5, the widest dimension is the diameter of the drilled hole, or in the case where the via connects to an internal transmission line (stripline for example) the widest dimension of the via includes the pad which is required to connect to the transmission line. Accordingly, the ground plane clearances around the via through the board are a varying dimensions, depending on the design rule described above. Thus, the layer changing vias of the preferred embodiment of the phase shifter can present a nearly uniform impedance to the propagating signal, and in the preferred embodiment of the phase shifter having eight phase shifting sections, as described above, a return loss of −13.6 dB or better has been demonstrated for all 256 states.

Figure 7:
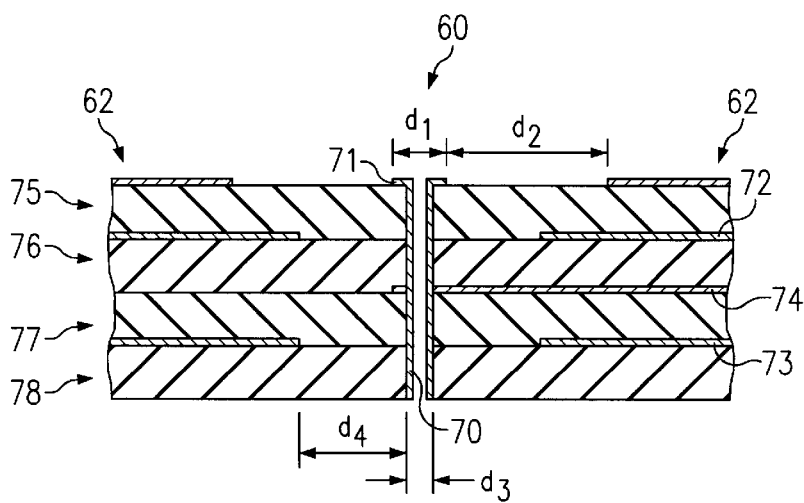
FIG. 7 shows a cross section view of the layer changing via of FIG. 6.

Directing attention to FIG. 7, a cross-section view of the layer changing via of FIG. 6 is shown. In FIG. 7, ground plane 62 can be seen on the same layer as the microstrip transmission line 61 (not shown in FIG. 7, as it is "coming out of the paper"). In FIG. 7 it can be seen that via 60 includes the drilled and plated hole 70 and layer I pad 71. Looking inside the circuit board, items 75, 76, 77, and 78 represent the dielectric substrates and/or laminates. As raw stock, the substrates generally come clad on both sides with copper foil, from which the transmission lines, ground planes and component pads are etched, and then laminated together to form the composite circuit board.

In FIG. 7, the via and its pad 71 have a diameter of $d_1$ associated therewith. The pad is an annular ring of metalization around the drilled and plated hole, which is used to make a reliable connection to the microstrip transmission line 61 of FIG. 6. According to the preferred embodiment of the present invention, the separation distance $d_2$ between the edge of the pad and the edge of the ground plane is approximately three times the dimension $d_1$, such that $d_2 \cong 3\ d_1$ and most preferably $d_2 = 3\ d_1$, in order to provide a constant 50 ohm impedance when a signal transitions from the microstrip to the layer changing via.

As described above, the preferred embodiment of the present invention utilizes microstrip and/or stripline transmission lines. Accordingly, ground plane 62 is not the only ground plane present in a preferred embodiment of the present invention. For example, as shown in FIG. 7, ground planes 72 and 73 may be disposed in the internal layers of the phase shifter. Specifically, ground plane 72 may be utilized to provide a ground reference for the microstrip transmission line 61. Similarly, ground planes 72 and 73 may be utilized to provide ground references for stripline transmission line 74 on layer 3 of the phase shifter.

Also shown in FIG. 7, the drilled hole of the via has a diameter of $d_3$ associated therewith. In order to provide a constant impedance throughout the layer changing via 60, a separation distance $d_4$ is provided between the hole and ground planes 72 and 73 of approximately three times the dimension $d_3$, such that $d_4 \cong 3\ d_3$ and most preferably $d_4 = 3\ d_3$. Accordingly, throughout the length of layer changing via 60, ground plane surfaces are disposed at a distance from the via as the diameter of the via at that point.

It should be appreciated that selection of the diameters $d_1$ and $d_3$ may be driven by a number of factors. For example, the diameter $d_3$ of the drilled hole 70 may be selected by manufacturing constraints, such as the minimum allowed diameter hole suitable for allowing a uniform and complete deposition of the metalized coating on the inside surface of the hole. Similarly, the diameter $d_1$ may be dictated by minimum necessary pad size that will ensure a reliable etched connection to the microstrip after the hole is drilled. Another consideration is the minimum size of $d_1$ that allows automated placement of probes for In-Circuit-Testing (ICT) of assembled circuit board assemblies.

Figure 8A:
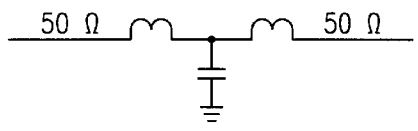
FIGS. 8A and SB show schematic diagrams of a layer changing via in a transmission line.
Figure 8B:
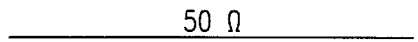

Directing attention to FIG. 8A, a schematic representation of a layer changing via disposed in a 50Ω transmission path shows that it typically includes inductance and capacitance. Selection of the dimensions as described above can mitigate these reactive elements and provide a consistent impedance (50Ω) as schematically illustrated in FIG. 8B.

One of the disadvantages of a switched line phase shifter is that it has a relatively narrow bandwidth, since each switched line exhibits the desired phase length at only one frequency. Accordingly, a preferred embodiment of the present invention allows the phase shifter to be used over the 3% bandwidth of the cellular transmit band by adapting the phase shifter to produce the desired phase shift at the high end of the band, i.e., 894 MHz, in the cellular transmit band of 869 to 894 MHz. For the remainder of the band, each phase shift section looks electrically shorter. This produces an actual phase shift that is less than the desired, as defined by the following equation: $\Phi_{ACTUAL} = (1 - (f_{ACTUAL}/f_{DESIGN}))\Phi_{DESIRED}$, where $f_{DESIGN}$ is the design frequency of the phase shift sections, e.g., the frequency where the 90° section results in exactly 90° of phase shift, $f_{ACTUAL}$ is the frequency of the signal propagating through the phase shifter that will result in some error (if not $f_{DESIGN}$), and $\Phi_{DESIRED}$ is the phase shift that results when the frequency of the propagating signal is $f_{DESIGN}$. To compensate for this error, the previously mentioned eighth, or "odd" section is provided to rotate the entire phase constellation as a pseudo-error correction. In a preferred embodiment this odd state is selected to be the maximum expected error, plus some margin to account for variations in the dielectric constant of the substrate material, for example, 36°, which is the expected maximum error at 894 MHZ plus a small amount of margin. Since the phase shifter of the preferred embodiment is only required to operate over narrow instantaneous bandwidth of 1.25 MHZ, associated with a particular channel, the odd state can be used to correct the phase shifter when it is operated at the lower end of the transmit band.

Figure 9:
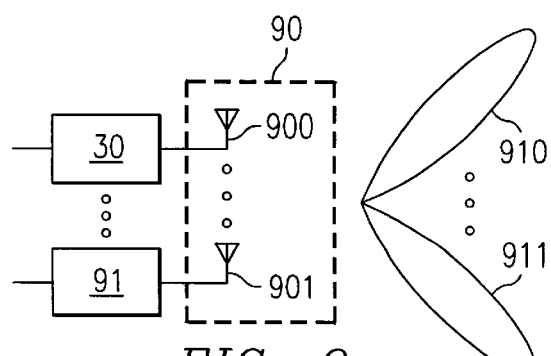
FIGS. 9 shows phase shifters of the present invention coupled to a phased array antenna.

Preferably, the phase shifter of the present invention provides phase shifting with low DC power consumption, which becomes very important in circumstances where a relatively large number of phase shifters are utilized, such as when many simultaneous antenna beams are generated. Accordingly, referring to FIG. 9, a preferred embodiment of phase shifter circuit 30 is disposed in a signal path associated with a radiating element 900 of phased array 90 and circuitry 91 duplicating phase shifter circuit 30 is disposed in another signal path associated with radiating element 901 of said phased array. Preferably, phased array 90 provides directional antenna beams 910–911 through controlled operation of the phase shifter circuits.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A switched line phase shifter comprising:
   a multiple layer support structure including dielectric strata;
   a primary signal transmission path supported by said multiple layer support structure;
   a plurality of secondary signal transmission paths supported by said multiple layer support structure, wherein ones of said secondary signal transmission paths are disposed on a different layer of said multiple layer support structure than said primary signal transmission path;
   a plurality of switchable circuits adapted to selectively place said primary signal transmission path in communication with particular secondary signal transmission paths of said plurality of secondary signal transmission paths;
   layer changing vias disposed in said multiple layer support to provide signal communication between said primary signal transmission path and ones of said secondary signal transmission paths disposed on different layers of said multiple layer support structure, wherein said layer changing vias provide a same impedance as said primary signal transmission path; and
   at least one ground plane supported by said multiple layer support structure, wherein said same impedance provided by said layer changing vias is achieved at least in part through maintaining a predetermined clearance between said layer changing vias and said at least one ground plane at all points.

2. The phase shifter of claim 1, wherein said multiple layer support structure is a printed circuit board.

3. The phase shifter of claim 1, wherein ones of said plurality of secondary signal transmission paths and ones of said plurality of switchable circuits are grouped to provide phase shifting stages each including a secondary signal transmission path associated with substantially zero phase shift and a secondary signal transmission path associated with a desired amount of phase shift.

4. The phase shifter of claim 3, wherein the secondary signal transmission path associated with substantially zero phase shift and the secondary signal transmission path associated with a desired amount of phase shift of said phase shifting stages are disposed on a same layer of said multiple layer support structure to thereby eliminate phase shift error associated with said layer changing vias.

5. The phase shifter of claim 1, wherein ones of said secondary signal transmission paths are stripline transmission lines disposed between layers of said multiple layer support structure.

6. The phase shifter of claim 5, wherein said stripline transmission lines are adapted to allow relatively tight radiusing to thereby provide for their turning back upon themselves and provide a small foot print phase shift transmission path.

7. The phase shifter of claim 1, wherein said at least one ground plane includes a plurality of ground planes disposed on different layers of said multiple layer support structure.

8. The phase shifter of claim 1, wherein said predetermined clearance at any particular point along said layer changing vias is approximately 3 times the diameter of said layer changing vias at said particular point.

9. The phase shifter of claim 1, wherein said primary signal transmission path is a microstrip transmission line disposed on a surface of said multiple layer support structure.

10. The phase shifter of claim 1, wherein ones of said secondary signal transmission paths are disposed on a plurality of layers of said multiple layer support structure.

11. The phase shifter of claim 1, wherein ones of said plurality of secondary signal transmission paths and ones of said plurality of switchable circuits are grouped to foil phase shifting stages each including a secondary signal transmission path associated with substantially zero phase shift and a secondary signal transmission path associated with a desired amount of phase shift.

12. The phase shifter of claim 11, wherein the phase shift of said secondary signal transmission paths associated with a desired amount of phase shift are selected for a frequency at a high end of a band of frequencies, and wherein a phase shift of said secondary signal transmission paths of a phase shifting stage of said phase shifting stages is selected to provide a pseudo-error-correcting phase shift to allow correction of phase shift error associated with a frequency at a low end of said band of frequencies.

13. The phase shifter of claim 12, wherein said pseudo-error-correcting phase shift is approximately equal to the largest expected error of the cardinal states, occurring at the low end of the frequency band.

14. The phase shifter of claim 12, wherein said high end frequency is approximately 894 MHZ and said low end frequency is approximately 869 MHZ.

15. The phase shifter of claim 11, wherein said plurality of switchable circuits comprise:
   PIN diodes adapted to independently select between said secondary signal transmission path associated with substantially zero phase shift and said secondary signal transmission path associated with a desired amount of phase at each said phase shifting stage.

16. The phase shifter of claim 11, wherein a plurality of said phase shifting stages have a phase shift of said secondary signal transmission path associated with a desired amount of phase shift that is a cardinal state of phase shifts of others of said plurality of phase shifting stages.

17. The phase shifter of claim 16, wherein said phase shifting stages include 8 phase shifting stages and said cardinal states of phase shift include 180°, 90°, 45°, 22.5°, 11.2°, 5.6°, and 2.8°.

18. A method for providing a desired amount of phase shift to an RF signal, said comprising the steps of:
   providing a primary signal transmission path on a dielectric material of a multiple layer support structure;
   providing a plurality of secondary signal transmission paths on a dielectric material of said multiple layer support structure, wherein ones of said secondary signal transmission paths are disposed on different layers of said multiple layer support structure than said primary signal transmission path;
   changeably coupling said primary signal transmission path with particular ones of secondary signal transmission paths; and
   providing a pseudo-error-correcting phase shift to correct for phase shift error associated with various frequencies of a frequency bandwidth.

19. The method of claim 18, wherein said step of providing a plurality of secondary signal transmission paths comprises the step of:
   adapting ones of said secondary signal transmission paths to provide a phase shift that is a cardinal state of phase shifts of other ones of said secondary signal transmission paths.

20. The method of claim 19, wherein said cardinal states of phase shift include 180°, 90°, 45°, 22.5°, 11.2°, 5.6°, and 2.8°.

21. The method of claim 18, further comprising the step of:
   providing a pseudo-error-correcting phase shift to correct for phase shift error associated with various frequencies of a frequency bandwidth.

22. The method of claim 18, further comprising the step of: providing layer-changing vias disposed in said multiple layer support to provide signal communication through at least one layer of said multiple layer support structure.

23. The method of claim 22, wherein the step of providing a plurality of secondary signal transmission paths comprises the step of:
   grouping ones of said plurality of secondary signal transmission paths to form phase shifting stages, each stage respectively including a secondary signal transmission path associated with substantially zero phase shift and a secondary signal transmission path associated with a desired amount of phase shift.

24. The method of claim 23, wherein the step of providing a plurality of secondary signal transmission paths further comprises the step of:
   disposing the secondary signal transmission path associated with substantially zero phase shift and the secondary signal transmission path associated with a desired amount of phase shift of said phase shifting stages on a same layer of said multiple layer support structure to thereby eliminate phase shift error associated with said layer changing vias.

25. The method of claim 22, further comprising the step of: adapting said layer-changing vias to provide a same impedance as said primary signal transmission path.

26. The method of claim 25, wherein said step of adapting said layer changing vias comprises the step of:
   maintaining a predetermined clearance between said layer changing vias and a ground plane provided in said multiple layer support structure.

27. The method of claim 26, wherein said predetermined clearance at any particular point along said layer changing vias is approximately 3 times the diameter of said layer changing vias at said particular point.

28. The method of claim 18, wherein said primary signal transmission path is a microstrip transmission line disposed on a surface of said multiple layer support stricture.

29. The method of claim 18, wherein ones of said secondary signal transmission paths are stripline transmission lines disposed between layers of said multiple layer support structure.

30. The method of claim 18, wherein said step of providing a plurality of secondary signal transmission paths comprises the step of:
   tightly radiusing ones of said secondary signal transmission paths to provide a small foot print phase shift transmission path.

31. The method of claim 18, wherein at least one secondary signal path of said secondary signal transmission paths is disposed on a plurality of layers of said multiple layer support structure.

32. The method of claim 18, wherein said step of changeably coupling said primary signal transmission path comprises the step of:
   biasing PIN diodes to independently select between secondary signal transmission paths of groupings of said secondary signal transmission paths.

33. A signal path traversing strata of a multiple stratum structure comprising:
   a signal conductor disposed in said multiple stratum structure to provide signal communication between a first signal path portion and a second signal path portion disposed at different strata of said multiple stratum structure, wherein said signal conductor provides a same impedance as said first signal path portion and said second signal path portion.

34. The signal path of claim 33, further comprising:
   a first portion; and
   a second portion, wherein a plurality of ground planes are present in said multiple stratum structure such that a plane of a first one of said plurality of ground planes bisects the signal conductor in said first portion and said same impedance provided by said signal conductor is achieved at least in part through maintaining a predetermined clearance between said signal conductor and said first ground plane, and wherein a plane of a second one of said plurality of ground planes bisects the signal conductor in said second portion and said same impedance provided by said signal conductor is achieved at least in part through maintaining a predetermined clearance between said signal conductor and said second ground plane.

35. The signal path of claim 34, wherein said first portion has a diameter of d1 and said clearance between said first ground plane and said first portion of said signal path is d2, such that $d2 \cong 3(d1)$.

36. The signal path of claim 34, wherein said second portion has a diameter of d3 and said clearance between said second ground plane and said second portion of said signal path is d4, such that $d4 \cong 3(d3)$.

37. The signal path of claim 33, wherein at least one ground plane is present in said multiple stratum structure and said same impedance provided by said signal conductor is achieved at least in part through maintaining a predetermined clearance between said signal conductor and said at least one ground plane.

38. The phase shifter of claim 37, wherein said predetermined clearance between said at least one ground plane and said signal conductor is 3 times a diameter of said signal conductor at a point in said signal conductor bisected by a plane of said at least one ground plane.

39. A switched line phase shifter comprising:
   a multiple layer support structure including dielectric strata;
   a primary signal transmission path supported by said multiple layer support structure;

a plurality of secondary signal transmission paths supported by said multiple layer support structure, wherein ones of said secondary signal transmission paths are disposed on a different layer of said multiple layer support structure than said primary signal transmission path; and a plurality of switchable circuits adapted to selectively place said primary signal transmission path in communication with particular secondary signal transmission paths of said plurality of secondary signal transmission paths, wherein ones of said plurality of secondary signal transmission paths and ones of said plurality of switchable circuits are grouped to form phase shifting stages each including a secondary signal transmission path associated with substantially zero phase shift and a secondary signal transmission path associated with a desired amount of phase shift, wherein the phase shift of said secondary signal transmission paths associated with a desired amount of phase shift are selected for a frequency at a high end of a band of frequencies, and wherein a phase shift of said secondary signal transmission paths of a phase shifting stage of said phase shifting stages is selected to provide a pseudo-error-correcting phase shift to allow correction of phase shift error associated with a frequency at a low end of said band of frequencies.

40. The phase shifter of claim 39, wherein said high end frequency is approximately 894 MHZ and said low end frequency is approximately 869 MHZ.

41. The phase shifter of claim 39, wherein said pseudo-error-correcting phase shift is approximately equal to the largest expected error of the cardinal states, occurring at the low end of the frequency band.

42. A system for providing selectable amounts of phase shift into an RF signal, said system comprising:

a multi-layer circuit board adapted to provide signal paths on multiple layers having ground planes disposed there between;

a plurality of primary signal path portions disposed on a first layer of said multi-layer circuit board;

a plurality of secondary signal path portions, wherein at least one secondary signal path portion is disposed on a second layer of said multi-layer circuit board; and a plurality of signal conductors disposed in said multi-layer circuit board to provide signal communication between ones of said primary signal path portions and ones of said secondary signal path portions, wherein said plurality of signal conductors provides a same impedance as said ones of said primary signal path portions and said ones of said secondary signal path portions; and a plurality of diodes adapted to selectively place ones of said primary signal path portions in communication with particular ones of said secondary signal path portions.

43. The system of claim 42, wherein said same impedance provided by said plurality of signal conductors is achieved at least in part through maintaining a predetermined clearance between said plurality of signal conductors and said ground planes.

44. The system of claim 43, wherein said predetermined clearance between said ground planes and said plurality of signal conductors is 3 times a diameter of said plurality of signal conductors at a point in said signal conductors bisected by a plane of said ground planes.

45. The system of claim 42, wherein a signal conductor of said plurality of signal conductors comprises:

a first portion; and a second portion, wherein a plurality of ground planes are present in said multi-layer circuit board such that a plane of a first one of said plurality of ground planes bisects the signal conductor in said first portion and said same impedance provided by said signal conductor is achieved at least in part through maintaining a predetermined clearance between said signal conductor and said first ground plane, and wherein a plane of a second one of said plurality of ground planes bisects the signal conductor in said second portion and said same impedance provided by said signal conductor is achieved at least in part through maintaining a predetermined clearance between said signal conductor and said second ground plane.

46. The system of claim 45, wherein said first portion has a diameter of d1 and said clearance between said first ground plane and said first portion of said signal conductor is d2, such that $d2 \cong 3(d1)$.

47. The system of claim 45, wherein said second portion has a diameter of d3 and said clearance between said second ground plane and said second portion of said signal conductor is d4, such that $\cong 3(d_2)$.

48. The system of claim 45, wherein ones of said plurality of secondary signal path portions and ones of said plurality of diodes are grouped to provide phase shifting stages each including a secondary signal path portion associated with a substantially zero phase shift and a secondary signal path portion associated with a desired amount of phase shift respectively.

49. The system of claim 48, wherein the secondary signal path portion associated with substantially zero phase shift and the secondary signal path portion associated with a desired amount of phase shift of said phase shifting stages are disposed on a same layer of said multi-layer circuit board.

50. The system of claim 48, wherein ones of said desired amounts of phase shift are a cardinal state of other ones of said desired amounts of phase shift.

51. The system of claim 50, wherein said cardinal states of phase shift include 180°, 90°, 45°, 22.5°, 11.2°, 5.6°, and 2.8°.

52. The system of claim 45, wherein ones of a phase shift of said secondary signal path portions are selected for a frequency at a high end of a band of frequencies, and wherein a phase shift of said secondary signal path portions is selected to provide a pseudo-error-correcting phase shift to allow correction of phase shift error associated with a frequency at a low end of said band of frequencies.

53. The system of claim 52, wherein said pseudo-error-correction phase shift is approximately equal to the largest expected error of the cardinal states, occurring at the low end of the frequency band.

54. The system of claim 52, wherein said high end frequency is approximately 894 MHZ and said low end frequency is approximately 869 MHZ.

55. The system of claim 45, wherein said system is disposed in a signal path of said signal paths provided by said multi-layer circuit board associated with a radiating element of a phased array and circuitry duplicating said system is disposed in other signal paths associated with radiating elements of said phased array.

56. The system of claim 55, wherein said phased array provides directional antenna beams through controlled operation of said system and said circuitry duplicating said system.

57. The system of claim 45, wherein said plurality of diodes comprise:

surface mount PIN diodes disposed on said first layer of said multi-layer circuit board.

* * * * *